US008632961B2

(12) United States Patent
Fohrenkamm et al.

(10) Patent No.: US 8,632,961 B2
(45) Date of Patent: Jan. 21, 2014

(54) FLEXOGRAPHIC PROCESSING SOLUTION AND USE

(75) Inventors: Elsie A. Fohrenkamm, St. Paul, MN (US); M. Zaki Ali, Mendota Heights, MN (US); Michael B. Heller, Iver Grove Heights, MN (US); Kevin M. Kidnie, St. Paul, MN (US)

(73) Assignee: Eastman Kodak Company, Rochester, NY (US)

( * ) Notice: Subject to any disclaimer, the term of this patent is extended or adjusted under 35 U.S.C. 154(b) by 765 days.

(21) Appl. No.: 12/695,190

(22) Filed: Jan. 28, 2010

(65) Prior Publication Data

US 2011/0183260 A1 Jul. 28, 2011

(51) Int. Cl.
*G03F 7/004* (2006.01)
*G03F 7/32* (2006.01)

(52) U.S. Cl.
USPC .......................................... 430/435; 430/306

(58) Field of Classification Search
USPC ............................... 430/270.1, 434
See application file for complete search history.

(56) References Cited

U.S. PATENT DOCUMENTS

| 5,011,620 | A | | 4/1991 | Dishart et al. |
| 5,112,743 | A | * | 5/1992 | Kamiya et al. ................ 430/175 |
| 5,128,234 | A | * | 7/1992 | Telser ........................... 430/306 |
| 5,248,502 | A | | 9/1993 | Ndife |
| 5,354,645 | A | | 10/1994 | Schober et al. |
| 5,679,175 | A | | 10/1997 | Hayes et al. |
| 6,030,748 | A | * | 2/2000 | Nishimiya et al. ......... 430/271.1 |
| 6,096,699 | A | | 8/2000 | Bergemann et al. |
| 6,162,593 | A | | 12/2000 | Wyatt et al. |
| 6,191,087 | B1 | | 2/2001 | Opre et al. |
| 6,248,502 | B1 | | 6/2001 | Eklund |
| 6,284,720 | B1 | | 9/2001 | Opre |
| 6,582,886 | B1 | | 6/2003 | Hendrickson et al. |
| 2005/0227182 | A1 | | 10/2005 | Ali et al. |
| 2006/0035170 | A1 | * | 2/2006 | Saito et al. ................. 430/270.1 |
| 2007/0093404 | A1 | | 4/2007 | Gross et al. |

FOREIGN PATENT DOCUMENTS

| EP | 0 365 987 A2 | 5/1990 |
| JP | 57 108851 A | 7/1982 |
| WO | WO 99/35538 A1 | 7/1999 |

OTHER PUBLICATIONS

U.S. Appl. No. 12/545,268, filed Aug. 21, 2009 titled Developing Solution for Flexographic Printing Plates by D.C. Bradford.
U.S. Appl. No. 12/546,780, filed Aug. 25, 2009 titled Flexographic Processing Solution and Method of Use by E. Fohrenkamm et al.
U.S. Appl. No. 12/391,344, filed Feb. 24, 2009 titled Polymer-Containing Solvent Purifying Process by D.C. Bradford et al.

* cited by examiner

*Primary Examiner* — Cynthia H Kelly
*Assistant Examiner* — Anna Conlin
(74) *Attorney, Agent, or Firm* — J. Lanny Tucker

(57) ABSTRACT

A processing solution (or developer) has been designed for use to washout non-polymerized photopolymer compositions to prepare flexographic printing plates having flexographic relief images. This processing solution includes one or more esters of monobasic carboxylic acids represented by one or both of Structures (I) and (II) defined herein and one or more aliphatic or aromatic alcohols.

1 Claim, No Drawings

US 8,632,961 B2

FLEXOGRAPHIC PROCESSING SOLUTION AND USE

FIELD OF THE INVENTION

This invention relates to organic solutions that can be used to "develop" or process imaged flexographic printing plates that are formed by crosslinking a photosensitive relief-forming layer. This invention also relates to a method of providing flexographic printing plates using these organic solutions.

BACKGROUND OF THE INVENTION

The production of photopolymer relief images for flexographic printing is generally carried out by imagewise exposing the photosensitive layer of a flexographic printing plate precursor using suitable imaging radiation such as UV radiation. Unexposed areas of the photosensitive layer are washed off (developed or "washed out") using a suitable developer or processing solution while exposed, crosslinked areas are left intact. Residual developer is generally removed by evaporation and if necessary, the developed surface is treated to remove tackiness. The flexographic printing plate is usually wrapped around a cylinder on a printing press and used to transfer ink to a suitable substrate such as papers, films, fabrics, ceramics, and other materials.

While the non-exposed photopolymer may be soluble in a variety of organic solutions, only some of those solutions are the best developers that do not damage or swell the crosslinked portions while cleanly removing the non-crosslinked portions. Swelling will eventually cause the relief image to deteriorate in the processing bath and the processing solution will have to be changed frequently due to the build-up of sludge.

Suitable developers have generally comprised organic solvents such as saturated hydrocarbons, aromatic hydrocarbons, aliphatic ketones, terpenes, and chlorinated hydrocarbons such as trichloroethylene, or mixtures of such solvents that may also include lower molecular weight alcohols depending upon the polymer binders used in the photosensitive layer.

Developers have been carefully formulated as mixtures of organic solvents to overcome various problems such as acting too slowly so that plate swelling occurs, solvent toxicity, safety concerns, long drying times, and ineffective removal from the developed printing plate. For example, U.S. Pat. No. 5,354,645 (Schober et al.) describes developers for flexographic printing relief images that include one or more of diethylene glycol dialkyl ethers, acetic acid esters or alcohols, carboxylic acid esters, and esters of alkoxy substituted carboxylic acids.

The development or washout of imaged photopolymerizable flexographic printing plate precursors is also described, for example, in U.S. Pat. Nos. 6,162,593 (Wyatt et al) and 5,248,502 (Eklund) and U.S. Patent Application Publication 2005/0227182 (Ali et al.), and the references cited in therein. Representative processing solutions (developers) are also described in U.S. Pat. No. 6,248,502 (Eklund). The photopolymer compositions used in the flexographic printing plate precursors are generally carefully matched to the desired processing solutions.

For example, U.S. Pat. No. 6,582,886 (Hendrickson et al.) cites a number of publications that describe various "matched" photosensitive layers and developers. This patent specifically describes developers containing methyl esters alone or mixtures of methyl esters and co-solvents such as various alcohols that are soluble in the methyl ester(s). These developers can also include various non-solvents such as petroleum distillates naphthas, paraffinic solvents, and mineral oils.

Other known processing solutions include chlorohydrocarbons, saturated cyclic or acyclic hydrocarbons, aromatic hydrocarbons, lower aliphatic ketones, or terpene hydrocarbons. While these processing solutions are effective for the intended purpose, they have a number of disadvantages. They may act too slowly, causing swelling in the printing plates and thus damage the fine detail in the relief images, require long drying times, and have low flashpoints resulting in dangerous situations. Many of these solvents are also considered hazardous air pollutants (HAPS) and are subject to stringent governmental reporting requirements. They may also be too toxic for direct disposal into the environment or create worker safety problems with strong odors or handling problems.

Copending and commonly assigned U.S. Ser. No. 12/545,268 filed Aug. 21, 2009 by Bradford and based on Provisional Application 61/097,358 (filed Sep. 19, 2008 by Bradford) describes flexographic printing plate washout or processing solutions containing dipropylene glycol dimethyl ether (DME) alone or in combination with various co-solvents such as alcohols and aliphatic dibasic acid ethers.

U.S. Pat. No. 6,162,593 (noted above) describes the use of diisopropylbenzene (DIPB) alone or with alcohol co-solvents in processing solutions.

Whether the processing solutions are reclaimed or not, there is a need for more environmentally friendly developing solutions that offer improvements in handling, disposal, low odor, and low levels of volatility (lower level of "volatile organic chemicals", or "VOC" content) while still providing the effective cleanout (or washout) of non-polymerized material in an imaged flexographic printing plate precursor. It is also desirable that the processing solution be useful for a variety of photopolymer compositions so that the processing solution is versatile for multiple uses.

While many of the known developers are effective for removing non-crosslinked materials in the imaged flexographic printing plate precursor, the developers are not necessarily environmentally friendly or free of health hazards (toxicity). Thus, there continues to be a need to provide improved flexographic printing plate developers that are non-hazardous, non-flammable, and environmentally friendly especially to aquatic life, and have low odor and a reduced level of VOC.

SUMMARY OF THE INVENTION

This invention provides a processing solution useful for providing flexographic relief images, comprising:

a. one or more esters of monobasic carboxylic acids represented by one or both of the following Structures (I) and (II):

$$R_1-C(=O)O-(CH_2)_n-Ar_1 \qquad (I)$$

wherein $R_1$ is an alkyl group having 1 to 5 carbon atoms, $Ar_1$ is a substituted or unsubstituted phenyl or naphthyl group, and n is 1 to 3, and

$$H-C(=O)OR \qquad (II)$$

wherein R is a hydrocarbon having 6 to 15 carbon atoms, and b. one or more aliphatic alcohols, or a combination of one or more aliphatic alcohols and one or more aromatic alcohols.

Some embodiments of this invention include a processing solution useful for providing flexographic relief images, comprising:

a. one or more esters of monobasic carboxylic acids represented by the following Structure (I):

$$R_1-C(=O)O-(CH_2)_n Ar_1 \quad (I)$$

wherein $R_1$ is an alkyl group having 1 to 5 carbon atoms, $Ar_1$ is a substituted or unsubstituted phenyl or naphthyl group, and n is 1 to 3, and b. one or more aliphatic alcohols, or a combination of one or more aliphatic alcohols and one or more aromatic alcohols.

More specific flexographic developers of this invention consisting essentially of:

a. from about 5 to about 70 weight % of benzyl acetate or propionate, b. from about 5 to about 40 weight % of 2-ethylhexyl alcohol, octyl alcohol, or benzyl alcohol, and c. from about 5 to about 50 weight % of a petroleum distillate.

This invention also provides a method of providing a flexographic printing plate with a relief image comprising developing an imaged flexographic printing plate precursor comprising an imageable photopolymer layer with the processing solution of this invention to remove non-imaged photopolymer.

More specifically, a method for providing a flexographic printing plate comprises:

A) imagewise exposing a flexographic printing plate precursor to provide exposed and non-exposed regions, B) removing the non-exposed regions with the processing solution of this invention to provide a relief image in a flexographic printing plate, and C) optionally, drying the processed flexographic printing plate.

The present invention provides improved developers (processing solutions) for imaged flexographic printing plate precursors, which developers are more environmentally friendly, less toxic or hazardous to users, and non-flammable, and have reduced VOC and odor. These features are achieved using the unique combination of specific solvents described herein.

DETAILED DESCRIPTION OF THE INVENTION

"VOC" refers to "volatile organic chemicals".

Unless otherwise indicated, the terms "processing solution", "developer", "washout solution" all refer to the compositions of this invention.

In addition, all percentages of processing solutions, unless otherwise noted, represent weight %.

The processing solution of this invention includes one or more esters of monobasic carboxylic acids. The esters of monobasic carboxylic acids used in the present invention generally have low vapor pressure. For example, both benzyl acetate and benzyl propionate have a vapor pressure of less than 0.1 mm Hg at ambient temperature (20° C.), which is desirable to reduce exposure of vapors around printing plate processing units. Unlike these solvents, the esters solvents known in the prior art, such as 2-ethylhexyl acetate as disclosed in U.S. Pat. No. 5,534,645, has a vapor pressure of 0.4 mm Hg. The esters used in the practice of the present invention do not have any objectionable odor. Usually, only one of these compounds is present.

The esters of monobasic carboxylic acids can be defined by either or both of Structures (I) and (II):

$$R_1-C(=O)O-(CH_2)_n-Ar_1 \quad (I)$$

$$H-C(=O)OR \quad (II).$$

The compounds represented by Structure (I) are particularly useful.

$R_1$ is a substituted or unsubstituted alkyl group having 1 to 5 carbon atoms (such as methyl, ethyl, n-propyl, iso-propyl, iso-butyl, t-butyl, and n-pentyl). $Ar_1$ is a substituted or unsubstituted phenyl or naphthyl group, and n is 1 to 4. R is a substituted or unsubstituted hydrocarbon (such as a substituted or unsubstituted alkyl or cycloalkyl group) having 6 to 15 carbon atoms. For example, $R_1$ can be an alkyl having 1 to 3 carbon atoms, n is 1 or 2, and R is benzyl or citronellyl.

Examples of useful esters of monobasic carboxylic acids include one of the more of benzyl acetate, 2-phenylethyl acetate, 2-phenylethyl phenyl acetate, 2-phenylethyl isobutyrate, isobutyl phenyl acetate, benzyl propionate, benzyl butyrate, benzyl pentanoate, benzyl formate, and citronellyl formate.

The one or more esters of monobasic carboxylic acids are present in the processing solution in an amount of at least 5 and up to and including 70 weight %, or from about 20 to about 60 weight %.

The useful esters of monobasic carboxylic acids can be obtained from a number of commercial sources.

Optionally, the processing solution can include one or more esters of monobasic carboxylic acids represented by the following Structure (III):

$$Ar_1-C(=O)O-R_2 \quad (III)$$

wherein $R_2$ is a substituted or unsubstituted saturated hydrocarbon group having 1 to 10 carbon atoms and $Ar_1$ is a substituted or unsubstituted phenyl or naphthyl group. $Ar_1$ is particularly a substituted or unsubstituted phenyl group, and $R_2$ is an alkyl group having 1 to 3 carbon atoms. Representative compounds defined by Structure (III) include but are not limited to, methyl benzoate or ethyl benzoate, or both. When such compounds are present, the amount is from about 5 to about 30 weight %.

In addition, the processing solution includes one or more aliphatic alcohols, or a combination of one or more aliphatic alcohols and one or more aromatic alcohols. The total amount of both types of alcohols is at least 5 and up to and including 40 weight %, or particularly from about 10 to about 30 weight %. These alcohols are generally available from various commercial sources.

Useful aliphatic alcohols include but are not limited to, n-butanol, 2-ethoxyethanol, a hexyl alcohol, a heptyl alcohol, an octyl alcohol, a nonyl alcohol, a decyl alcohol, alpha-terpineol, dipropylene glycol methyl ether, 2-butoxyethanol, isopropyl alcohol, and 2-(2-butoxyethoxy)ethanol, substituted or unsubstituted cyclopentanol, substituted or unsubstituted cyclohexanol, substituted or unsubstituted cycloheptanol, cyclopentyl substituted alcohol, cyclohexyl substituted alcohol, and cycloheptyl substituted alcohol.

Useful aromatic alcohols include but are not limited to, benzyl alcohol, 2-phenylethyl alcohol, and isopropylbenzyl alcohol.

Three particularly useful alcohol co-solvents include 2-ethylhexyl alcohol, benzyl alcohol, n-octyl alcohol, and mixtures thereof.

The processing solution can also include one or more aliphatic hydrocarbons in an amount of up to 50 weight %. Useful compounds of this type include but are not limited to, hydrocarbon paraffins, isoparaffins, naphthenic hydrocarbons, petroleum distillates, terpene hydrocarbons, mixed aromatic solvents, or halogenated hydrocarbon solvents. An advantage of the present invention is that substituted or unsubstituted aromatic hydrocarbons, which are usually found to be marine pollutants, and are not generally needed for effective development of many photopolymer-containing flexographic printing plate precursors.

After its use to develop imaged flexographic printing plate precursors, the processing solution of this invention can be reclaimed in a suitable fashion or disposed of in an environmentally proper manner.

Some useful flexographic printing plate precursors are described in numerous publications including but not limited to, U.S. Patent Application Publication 2005/0227182 (noted above) and U.S. Pat. Nos. 7,226,709 (Kidnie et al.) and U.S. Pat. No. 7,326,353 (Hendrickson et al.), all of which are incorporated herein by reference.

For example, the precursors are generally composed of a photopolymerizable elastomer or elastomeric layer composition disposed on a suitable support. By the term "photopolymerizable", we mean that the composition is polymerizable or crosslinkable using suitable radiation, or both polymerizable and crosslinkable. The elastomeric layer composition generally includes a thermoplastic binder, at least one monomer and an initiator (photoinitiator) that is sensitive to suitable radiation such as actinic radiation (for example, UV radiation). Various polymeric binders are known in the art as described in the publications noted in the preceding paragraph. Poly(styrene/isoprene/styrene) and poly(styrene/butadiene/styrene) block copolymers are useful, as well as various synthetic or natural polymers of conjugated hydrocarbons, including polyisoprene, 1,2-polybutadiene, and butadiene/acrylonitrile.

The "monomer" is generally considered a compound that is compatible with the polymeric binder and is capable of addition polymerization in response to irradiation with actinic radiation. There can be a mixture of monomers if desired. They typically have a molecular weight less than 5000 although compounds with higher molecular weight can be used if desired. Useful monomers include various acrylates, methacrylates, mono- and polyesters of alcohols and polyols such as polyacrylates and polymethacrylates. Photoinitiators can include but are not limited to, compounds that generate free radicals upon exposure to actinic radiation such as quinones, benzophenones, benzoin ethers, aryl ketones, peroxides, biimidazoles, benzyl dimethyl ketal, and others known in the art.

The elastomeric layer composition can also include various additives such as colorants, processing aids, antioxidants, and antiozonants as are known in the art.

Additionally, a protective cover sheet can be placed over the photosensitive elastomeric composition layer, which cover sheet contains a protective polymer that is soluble or dispersible in the solvent(s) that is capable of dissolving or dispersing the uncured photosensitive elastomeric composition. Generally, the protective layer is transparent and has little tackiness before irradiation. It can be washed away or removed using the processing solutions described herein. Examples of polymers suitable for preparing this cover sheet include but are not limited to, polyamides and cellulose esters such as cellulose acetate butyrate and cellulose acetate propionate (for example, see U.S. Pat. No. 6,030,749 of Takahashi et al., Cols. 4-8).

The flexographic printing plate precursors that can be processed according to this invention in general comprise a photopolymerizable elastomeric layer comprising an elastomeric binder, a photoinitiator, at least one compound that is free radical crosslinkable with actinic radiation (such as a monomer), and optionally a plasticizer.

Such flexographic printing plate precursors can be imaged by exposure to curing radiation through a suitable mask image to form an imaged element. In this step, the curing radiation is projected onto the photosensitive composition through the mask image that blocks some of the radiation. The exposed regions are hardened or cured. Exposure through the mask image can be accomplished by floodwise exposure from suitable irradiation sources (visible or UV radiation). For example, curing radiation may be at a radiation at a wavelength of from about 340 to about 400 nm from a suitable irradiation source. The time for exposure through the mask image will depend upon the nature and thickness of the flexographic printing plate precursor and the source of the radiation. For example, useful commercial flexographic printing plate precursors such as Eastman Kodak's FLEXCEL brand precursors and DuPont's Cyrel® brand precursors can be imaged on commercial apparatus such as a Mekrom processor, model 302 EDLF.

The processing solution can be applied to an imaged flexographic printing plate precursor in any suitable manner including but not limited to, spraying, brushing, rolling, dipping (immersing), or any combination thereof. This removes uncured or non-polymerized regions of the photopolymerizable composition. Development or processing is usually carried out under conventional conditions such as for from about 5 to about 20 minutes and at from about 23 to about 32° C. The specific development conditions will be dictated by the type of apparatus used and the specific processing solution.

Post-developing processing of the relief image may be suitable under some circumstances. Typical post-development processing includes drying the relief image to remove any excess processing solution and post-curing by exposing the relief image to curing radiation to cause further hardening or crosslinking. The conditions for these processes are well known to those skilled in the art. For example, the relief image may be blotted or wiped dry or dried in a forced air or infrared oven. Drying times and temperatures would be readily apparent to one skilled in the art.

Detackification can be carried out if the flexographic printing plate is still tacky after drying. Such treatments, for example, by treatment with bromide or chlorine solutions or exposure to UV or visible radiation, are well known to a skilled artisan.

The resulting relief image may have a depth of from about 2% to about 100% (typically from about 10 to about 80%) of the original thickness of the radiation-sensitive composition in the flexographic printing plate precursor. For example, if the radiation-sensitive composition is disposed on a non-photosensitive support, up to 100% of the radiation-sensitive composition can be removed in the relief image. The relief image depth may be from about 150 to about 2000 μm The flexographic printing plates can be used to advantage in the formation of seamless, continuous flexographic printing elements, or they can be formed as flat sheets that can be wrapped around a cylinder form, for example as a printing sleeve or the printing cylinder itself. Alternatively, the radiation-sensitive composition can be mounted around a cylindrical form for imaging and development.

The present invention provides at least the following embodiments and combinations thereof:

1. A processing solution useful for providing flexographic relief images, comprising:

a. one or more esters of monobasic carboxylic acids represented by one or both of the following Structures (I) and (II):

$$R_1\text{---}C(=O)O\text{---}(CH_2)_n\text{---}Ar_1 \qquad (I)$$

wherein $R_1$ is an alkyl group having 1 to 5 carbon atoms, $Ar_1$ is a substituted or unsubstituted phenyl or naphthyl group, and n is 1 to 3, and $$H\text{---}C(=O)OR \qquad (II)$$

wherein R is a hydrocarbon having 6 to 15 carbon atoms, and b. one or more aliphatic alcohols, or a combination of one or more aliphatic alcohols and one or more aromatic alcohols.

2. The solution of embodiment 1 wherein the one or more esters of monobasic carboxylic acids are present in an amount of at least 5 and up to and including 70 weight %, and the one or more aliphatic alcohols, or combination of one or more aliphatic alcohols and one or more aromatic alcohols, are present in an amount of at least 5 and up to and including 40 weight %.

3. The solution of embodiment 1 or 2 wherein the one or more esters of monobasic carboxylic acids are present in an amount of from about 20 to about 60 weight %, and the one or more aliphatic alcohols, or combination of one or more aliphatic alcohols and one or more aromatic alcohols, are present in an amount of from about 10 to about 30 weight %.

4. The solution of any of embodiments 1 to 3 wherein $R_1$ is an alkyl having 1 to 3 carbon atoms, n is 1 or 2, and R is benzyl or citronellyl.

5. The solution of any of embodiments 1 to 4 wherein the one or more esters of monobasic carboxylic acids includes one of the more of benzyl acetate, 2-phenylethyl acetate, 2-phenylethyl phenyl acetate, 2-phenylethyl isobutyrate, isobutyl phenyl acetate, benzyl propionate, benzyl butyrate, benzyl pentanoate, benzyl formate, and citronellyl formate.

6. The solution of any of embodiments 1 to 5 wherein one or more aliphatic alcohols includes one or more of n-butanol, 2-ethoxyethanol, a hexyl alcohol, a heptyl alcohol, an octyl alcohol, a nonyl alcohol, a decyl alcohol, alpha-terpineol, dipropylene glycol methyl ether, 2-butoxyethanol, isopropyl alcohol, and 2-(2-butoxyethoxy)ethanol, substituted or unsubstituted cyclopentanol, substituted or unsubstituted cyclohexanol, substituted or unsubstituted cycloheptanol, cyclopentyl substituted alcohol, cyclohexyl substituted alcohol, cycloheptyl substituted alcohol, and citronellol, the one or more aromatic alcohols include one or more of benzyl alcohol, phenylethyl alcohol, isopropylbenzyl alcohol, and phenylpropyl alcohol.

7. The solution of any of embodiments 1 to 6 further comprising an aliphatic hydrocarbon in an amount of from about 10 to about 50 weight % of one or more hydrocarbon paraffins, isoparaffins, naphthenic hydrocarbons, petroleum distillates, de-aromatized petroleum distillates, terpene hydrocarbons, mixed aromatic solvents, and halogenated hydrocarbon solvents.

8. The solution of embodiment 7 wherein the aliphatic hydrocarbon is one or more of de-aromatized petroleum distillates, hydrocarbon paraffins and iso-paraffins.

9. The solution of any of embodiments 1 to 8 further comprising one or more esters of monobasic carboxylic acids represented by the following Structure (III):

$$Ar_1-C(=O)O-R_2 \quad (III)$$

wherein $R_2$ is a saturated hydrocarbon group having 1 to 10 carbon atoms and $Ar_1$ is a substituted or unsubstituted phenyl or naphthyl group.

10. The solution of embodiment 9 wherein $Ar_1$ in Structure (III) is a substituted or unsubstituted phenyl group, and $R_2$ is an alkyl group having 1 to 3 carbon atoms or a cycloalkyl having 5 to 10 carbon atoms in the carbocyclic ring.

11. A processing solution useful for providing flexographic relief images, comprising:

a. one or more esters of monobasic carboxylic acids represented by the following Structure (I):

$$R_1-C(=O)O-(CH_2)_n-Ar_1 \quad (I)$$

wherein $R_1$ is an alkyl group having 1 to 5 carbon atoms, $Ar_1$ is a substituted or unsubstituted phenyl or naphthyl group, and n is 1 to 3, and b. one or more aliphatic alcohols, or a combination of one or more aliphatic alcohols and one or more aromatic alcohols.

12. The solution of embodiment 11 wherein the one or more esters of monobasic carboxylic acids includes one of the more of benzyl acetate, 2-phenylethyl acetate, 2-phenylethyl phenyl acetate, 2-phenylethyl isobutyrate, isobutyl phenyl acetate, benzyl propionate, benzyl butyrate, benzyl pentanoate, benzyl formate, and citronellyl formate, the one or more aliphatic alcohols includes one or more of n-butanol, 2-ethoxyethanol, a hexyl alcohol, a heptyl alcohol, an octyl alcohol, a nonyl alcohol, a decyl alcohol, alpha-terpineol, dipropylene glycol methyl ether, 2-butoxyethanol, isopropyl alcohol, and 2-(2-butoxyethoxy)ethanol, substituted or unsubstituted cyclopentanol, substituted or unsubstituted cyclohexanol, substituted or unsubstituted cycloheptanol, cyclopentyl substituted alcohol, cyclohexyl substituted alcohol, cycloheptyl substituted alcohol, and citronellol, and the one or more aromatic alcohols include one or more of benzyl alcohol, phenylethyl alcohol, isopropylbenzyl alcohol, and phenylpropyl alcohol.

13. A flexographic developer consisting essentially of:

a. from about 5 to about 70 weight % of benzyl acetate or propionate, b. from about 5 to about 40 weight % of 2-ethylhexyl alcohol, octyl alcohol, or benzyl alcohol, and c. from about 5 to about 50 weight % of a petroleum distillate.

14. A method of providing a flexographic printing plate with a relief image comprising developing an imaged flexographic printing plate precursor comprising an imageable photopolymer layer with the processing solution of any of embodiments 1 to 13 to remove non-imaged photopolymer.

15. A method for providing a flexographic printing plate comprising:

A) imagewise exposing a flexographic printing plate precursor to provide exposed and non-exposed regions, B) removing the non-exposed regions with the processing solution of any of embodiments 1 to 13 to provide a relief image in a flexographic printing plate, and C) optionally, drying the processed flexographic printing plate.

16. The method of embodiment 14 or 15 wherein the flexographic printing plate precursor comprises a photopolymerizable elastomeric layer comprising an elastomeric binder, a photoinitiator, at least one monomer, and optionally a plasticizer, and the precursor is imagewise exposed using actinic radiation.

The following Examples are provided to illustrate the practice of this invention but not to limit it in any manner.

Invention Examples 1-4 and Comparative Examples 1-4

Several flexographic plate developer solutions of this invention were prepared and compared to several developer solutions of the prior art, as shown below in TABLE I. To judge the effectiveness of the developer solutions to remove the un-crosslinked polymers in the imaged flexographic printing plate precursors, the following procedure was followed:

A fixed amount (20 g) of each developer solution was placed in a jar. Each solution contained 50 weight % of an ester solvent, 20 weight % of an aliphatic hydrocarbon (Marathon 142 Solvent, from Marathon), and 30 weight % of an aliphatic alcohol (Exxal 8 isooctyl alcohol, obtained from Exxon Mobil). A flexographic printing plate precursor (Flexcel® SRH, 1.70 mm, from Eastman Kodak Company) was cut into small pieces (3"×⅝", or 7.6×1.6 cm), the cover sheet was removed, and then the flexographic printing plate precursor sample was precisely weighed in an analytical balance. Each sample was then placed inside a jar containing a developing solution and the jar lid was closed. The bottle was then shaken for an hour in a mechanical shaker. Each sample was then carefully removed by tweezers and was then was placed on a cardboard with the poly(ethylene terephthalate) support side down. The wet imaged printing plate was then placed in an oven set at 66° C. and dried for one hour. The dried printing plates were brought to room temperature and weighed again on the analytical balance. The difference in the weight of the printing plate after development and before development was indicative of the efficiency of the developer solution. Thus, a larger weight loss indicates more efficient removal of the un-crosslinked polymer by the developer solution. For Comparative Examples 2 and 3, solvent mixtures were prepared using ethyl nonanoate (nonanoic acid ethyl ester) and ethyl octanoate (octanoic acid ethyl ester), as described in U.S. Pat. No. 5,354,645 (noted above). A commercially available developer solution that is known to contain nonyl acetate and benzyl alcohol (Optisol® Rotary from DuPont) as described in U.S. Pat. No. 5,354,645, was also tested as a Comparative example.

It is clearly evident from these data in TABLE I that the developer solutions of the present invention are very efficient in removing the un-crosslinked photopolymer from the imaged flexographic printing plate precursors. Invention Example 4 shows that a combination of an aliphatic alcohol and an aromatic alcohol further enhances the efficiency of the removal of un-crosslinked polymer. Comparative Example 1 performed well but had an objectionable odor.

(Dupont) as Comparative Example 5, to prepare flexographic printing plates in a commercially available Kelleigh 310 processing unit.

An unexposed commercially available 0.067 inch (0.17 cm) thick photopolymer flexographic printing plate precursor (Kodak Flexcel® SRH) was cut into sample strips measuring 2 inch×12 inch (5.1 cm×30.5 cm) and the sample strips were clamped 8 abreast along the width of the Kelleigh processing drum. The brush pressure in the processor was adjusted to a setting of 3.5 and the processing was started. Beginning at 8 minutes of processing, the printing plate samples were removed one every 2 minutes. Each sample strip was blotted dry with a non-lint plate wipe fabric and placed in the Kelleigh drying section set to 60° C. After drying for 2 hours, the plates were removed from the drying section. The dried printing plate samples were then finished for 10 minutes exposure to UVC light and 3 minutes exposure to UVA light. Measurements were made with an Ono-Sokki model EG-225 digital caliper by comparing the unexposed washed out area of each sample to the original sample caliper (0.067 inch, 0.17 cm). The difference between the unexposed washed out plate sample and the original plate sample caliper was recorded as the relief image depth. The relief image depth was plotted verses processing times for each processing solution that was tested. The point where processing time intersects a 0.040 inch (0.10 cm) relief image depth is listed in TABLE II as "Wash-out Time."

A commercially available 0.067 inch (0.17 cm) thick photopolymer flexographic printing plate precursor (Kodak Flexcel® SRH) was first back exposed by a UV light source for 40 seconds with a commercially available Kelleigh model 310 exposure/processor/drier/finisher unit. The top of the printing plate precursor was then exposed to UV light for 15 minutes through a negative film (mask) made from commercially available Kodak Flexcel® NX thermal imaging layer. The

TABLE I

| Example | Composition (% by weight) | Initial Weight of plate (g) | Final Weight of plate (g) | Weight loss (g) | % Un-crosslinked polymer removed |
|---|---|---|---|---|---|
| Invention 1 | Benzyl acetate: 50%<br>Marathon 142 Solvent: 20%<br>Exxal 8: 30% | 2.1171 | 1.0388 | 1.0783 | 50.93% |
| Invention 2 | Benzyl Formate: 50%<br>Marathon 142 Solvent: 20%<br>Exxal 8: 30% | 2.1394 | 1.0948 | 1.0446 | 48.83% |
| Invention 3 | Benzyl Propionate: 50%<br>Marathon 142 Solvent: 20%<br>Exxal 8: 30% | 2.2170 | 1.1192 | 1.0978 | 49.5% |
| Comparative 1 | Methyl Benzoate: 50%<br>Marathon 142 Solvent: 20%<br>Exxal 8: 30% | 2.1299 | 1.0522 | 1.0777 | 50.60% |
| Comparative 2 | Ethyl Nonanoate: 50%<br>Marathon 142 Solvent: 20%<br>Exxal 8: 30% | 2.1404 | 1.8991 | .2413 | 11.27% |
| Comparative 3 | Ethyl Octanoate: 50%<br>Marathon 142 Solvent: 20%<br>Exxal 8: 30% | 2.1770 | 1.7764 | .4006 | 18.40% |
| Comparative 4 | Optisol ® Rotary solution | 2.2014 | 1.5508 | .6505 | 29.55% |
| Invention 4 | Benzyl Acetate: 40%<br>Marathon 142 Solvent: 40%<br>Exxal 8: 10%<br>Benzyl Alcohol: 10% | 2.1327 | .8130 | 1.3227 | 61.93% |

Invention Examples 5-6 and Comparative Example 5

Two embodiments of the present invention were compared to the use of the commercially available Optisol® Rotary images on the mask contained multiple repeating sections, small halftone dots of various line rulings as well as fine line and text images to determine image quality. The mask also contained $D_{min}$ areas to generate fully crosslinked patches on the precursor for caliper measurements to determine drying time. The mask was removed from the printing plate precursor that was then processed in the Kelleigh model 310 processor for a predetermined length of time based on the processing time test. After processing, the printing plates were blotted dry using a non-lint plate wipe fabric and placed in the drying section of the Kelleigh processor. Caliper measurements of the printing plates in the fully exposed area were made at 10 minute intervals using an Ono-Sokki model EG-225 digital caliper. "Dry Times" listed in TABLE II were determined when the printing plates reached a steady state where no thickness decrease was measurable.

The dried printing plates were then finished by 10 minutes exposure to UVC light and 3 minutes exposure to UVA light using the Kelleigh model 310 processor. The plates were then examined under a 60× stereo microscope to determine image quality by examining the areas of small dots and looking for misshapen or missing dots. The fine line rulings and text areas were examined for shoulder angle and structure. The results of the microscopic examination are listed as "Image Quality" in TABLE II.

TABLE II

| Example | Processing Solution | Processing Time (min.) | Drying Time (min) | Image Quality |
|---|---|---|---|---|
| Comparative 5 | DuPont Rotary Optisol ® | 20.0 | 90 | Excellent |
| Invention 5 | Marathon 142 solvent: 50% Benzyl Acetate: 30% Benzyl Alcohol: 10% Exxal 8, 10% | 11.5 | 120 | Excellent |
| Invention 6 | Marathon 142 solvent: 50% Benzyl Acetate: 30% Benzyl Alcohol: 5% Exxal 8: 15% | 10 | 120 | Excellent |

It is evident from the data in TABLE II that the processing solutions of this invention containing the noted ester solvents washed out the un-crosslinked photopolymer more efficiently than the prior art processing solution, and are capable of producing high image quality flexographic printing plates required for commercial applications. Although the drying time was a little longer than for the Comparative Example 5 processing solution, the drying time was a commercially acceptable time.

The invention has been described in detail with particular reference to certain preferred embodiments thereof, but it will be understood that variations and modifications can be effected within the spirit and scope of the invention.

The invention claimed is:

1. A flexographic developer consisting essentially of:
   a. from about 5 weight % to about 70 weight % of benzyl acetate or propionate,
   b. from about 5 weight % to about 40 weight % of 2-ethylhexyl alcohol, octyl alcohol, or benzyl alcohol in combination with 2-ethylhexyl alcohol, or octyl alcohol, and
   c. from about 5 weight % to about 50 weight % of a petroleum distillate.

* * * * *